United States Patent
Mieda

(10) Patent No.: US 7,053,710 B2
(45) Date of Patent: May 30, 2006

(54) VACUUM TUBE AMPLIFIER HAVING GRID AS OUTPUT AND PLATE AS INPUT

(75) Inventor: Fumio Mieda, Tokyo (JP)

(73) Assignee: Korg, Inc., Tokyo (JP)

( * ) Notice: Subject to any disclaimer, the term of this patent is extended or adjusted under 35 U.S.C. 154(b) by 0 days.

(21) Appl. No.: 10/817,782

(22) Filed: Apr. 2, 2004

(65) Prior Publication Data
US 2004/0257158 A1    Dec. 23, 2004

(30) Foreign Application Priority Data
Apr. 3, 2003   (JP) ............................. 2003-100538

(51) Int. Cl.
*H03F 1/00*    (2006.01)
(52) U.S. Cl. ...................................... 330/162; 330/70
(58) Field of Classification Search ............... 330/162, 330/70, 153, 165, 123, 71
See application file for complete search history.

(56) References Cited

U.S. PATENT DOCUMENTS

| 4,211,893 A | * | 7/1980 | Smith | 330/149 |
| 4,593,251 A | * | 6/1986 | Smith | 330/123 |
| 5,680,074 A | * | 10/1997 | Yamasita | 330/70 |
| 5,880,632 A | * | 3/1999 | Yamasita | 330/70 |

FOREIGN PATENT DOCUMENTS

JP         2000-031754         1/2000

* cited by examiner

*Primary Examiner*—John Nguyen
*Assistant Examiner*—Lam T. Mai
(74) *Attorney, Agent, or Firm*—Muramatsu & Associates

(57) ABSTRACT

A vacuum tube amplifier is formed of a vacuum tube having a cathode, a plate, a grid, and a heater to radiate electrons from the cathode. An input signal is supplied to the plate, an output signal is obtained at the grid, and a predetermined low voltage is supplied to the heater. The voltage supplied to the heater can be low, thereby significantly decreasing an overall consumption of electric power for the vacuum tube amplifier.

3 Claims, 1 Drawing Sheet

VACUUM TUBE AMPLIFIER HAVING GRID AS OUTPUT AND PLATE AS INPUT

FIELD OF THE INVENTION

This invention relates to a vacuum tube amplifier, and more particularly, to a vacuum tube amplifier having a cathode, a plate, and a grid where the plate receives an input and the grid produces an output signal.

BACKGROUND OF THE INVENTION

Vacuum tube amplifier circuits are proposed in various areas. Such a vacuum tube amplifier circuit has a grid, a plate, a cathode and a heater to radiate electrons from the cathode. In general, when being heated by the heater, the electrons radiated from the cathode reach the plate. The amount of radiated electrons reaching the plate is regulated by the grid, thereby amplifying the input signal.

Various amplifiers utilizing a vacuum tube are proposed for applications of electric and electronics music instruments, audio instruments, etc. When a vacuum tube is used as a signal amplifier, it is so configured that an input signal is provided to the grid of the vacuum tube and the amplified output signal is obtained at the plate. Such a conventional vacuum tube amplifier is described in Japanese laid-open patent publication No. 2000-31754.

However, a conventional vacuum tube amplifier has a disadvantage in that it consumes a large amount of electric power due to the heater and thus is less efficient compared with transistor amplifiers or other amplifiers. Accordingly, a new type of a vacuum amplifier with improved electric power efficiency is desired by, for instance, decreasing the voltage for the heater.

SUMMARY OF THE INVENTION

It is, therefore, an object of the present invention to provide a vacuum tube amplifier that has improved electric power efficiency.

The vacuum tube amplifier of the present invention is characterized in that a vacuum tube has a cathode, a plate, a grid, and a heater to radiate electrons from the cathode, wherein an input signal is supplied to the plate, an output signal is obtained at the grid, and a predetermined low voltage is supplied to the heater.

In one aspect of the present invention, a voltage supplied to the heater of the vacuum tube amplifier to heat the cathode is less than 3V.

DETAILED DESCRIPTION OF THE INVENTION

Figure 1:
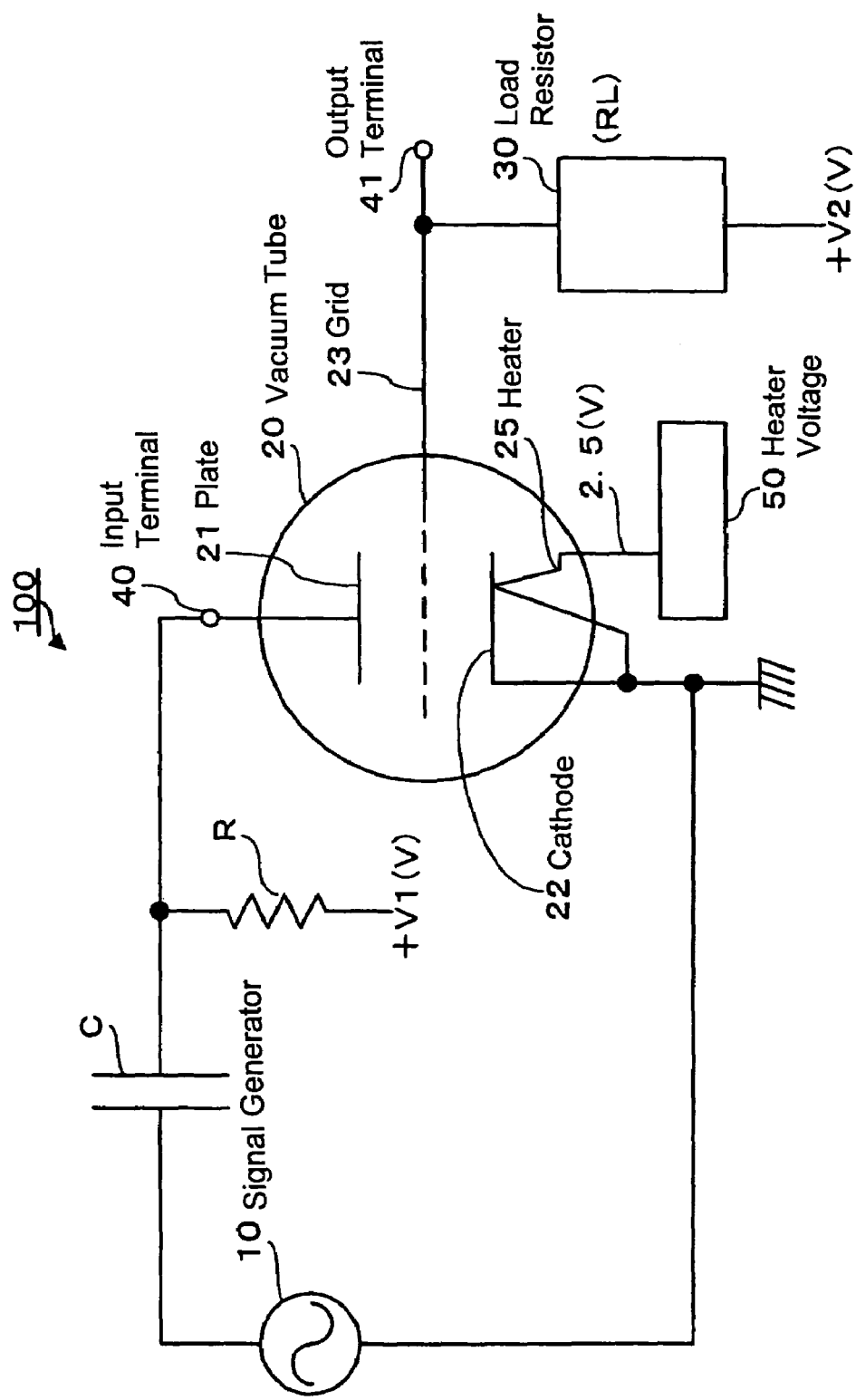
FIG. 1 is a schematic diagram showing a vacuum tube amplifier circuit in the present invention having a cathode, plate, and grid where the plate receives an input signal and the grid produces an output signal.

The present invention will be described in detail with reference to the accompanying drawing.

FIG. 1 is a schematic diagram of a vacuum tube circuit 100 in accordance with the present invention. A plate 21, a grid 23, and a cathode 22 are arranged for a vacuum tube 20 as shown in FIG. 1. An input terminal 40 to provide input signal is connected to the plate 21. A positive voltage V1 is provided to the input terminal 40 through a resistor R. Thus, a positive bias voltage is applied to the plate 21. A capacitor C is connected in series between the input terminal 40 and a signal generator 10. Thus, an alternating signal from the signal generator 10 is provided to the plate 21 through the input terminal 40. In other words, the input signal is supplied to the plate 21 rather than the grid 23.

A heater 25 heats the cathode 22 in the vacuum tube 20 to radiate electrons toward the plate 21. One terminal of the cathode 22 and one terminal of the signal generator 10 are connected to the grounded. A heater voltage source 50 is provided to supply the voltage to the heater 25. The heater voltage source 50 supplies a predetermined low voltage (such as 2.5V) in order to heat the heater 25. Considering that a heater voltage in a conventional vacuum tube amplifier is about 6V, the heater voltage in the present invention is significantly reduced to less than a half of the conventional heater voltage, thus, the electric power consumed by the heater for the vacuum tube 20 is significantly reduced.

In the vacuum tube circuit 100, an output terminal 41 is provided to the grid 23 that regulates the amount of electrons from the cathode 22 reaching the plate 21. In the example shown in FIG. 1, one terminal of a load resistor (RL) 30 is connected to a positive voltage V2 and the other terminal of the load resistor 30 is connected to the output terminal 41. Thus, the output signal is obtained from the grid 23 of the vacuum tube 20 rather than the plate 21.

In an example of vacuum tube amplifier having the configuration described above, a voltage gain of the vacuum tube amplifier is 3.5 where the capacitance of the capacitor C is 10 μF, the resistance of the resistor R is 2.2K ohm, the resistance of the load resistor RL is 100K ohm, the voltage V1 is 0.78V, and the voltage V2 is 5V.

The output signal from the output terminal 41 is 2.65 (DC)+0.7Vpp (AC) where the input signal at the input terminal 40 is 0.78 (DC)+0.2Vpp (AC) where DC denotes direct current, AC denotes alternating current, and Vpp denotes peak-to-peak voltage. Moreover, the input signal and the output signal have the same phase (non-inverted phase). Further, the output signal is not abruptly clipped even when the input signal is increased, which means that the amplifier has a smooth saturation characteristic.

As has been described above, in the vacuum tube having the cathode, the plate, the grid, and the heater to radiate electrons from the cathode, the input signal is supplied to the plate, the vacuum tube is able to produce an amplified output signal even when the heater voltage is low. The input signal and the output signal have the same phase, i.e., the output is a non-inverted signal of the input signal. The vacuum tube amplifier has a smooth saturation characteristic curve and, thus, output signal is not abruptly clipped even when the input signal is increased. Because such an ideal distortion characteristic can be obtained, the vacuum tube amplifier of the present invention can be applied to specific fields such as electrical music instruments.

The present invention is not limited to the embodiment described above. For instance, the values of the capacitor C, resistors R and RL, voltages V1 and V2 can be varied to match the specific needs.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. A vacuum tube amplifier, comprising:
a vacuum tube having a cathode, a plate, and a grid; and
a heater to radiate electrons from the cathode;
wherein an input signal is supplied to said plate, an amplified output signal is obtained at said grid, and a predetermined low voltage is supplied to said heater.

2. A vacuum tube amplifier as claimed in claim 1, wherein said voltage supplied to said heater is less than 3V.

3. A vacuum tube amplifier as claimed in claim 1, wherein said voltage supplied to said heater is about 2.5V.

* * * * *